(12) United States Patent
Tarr et al.

(10) Patent No.: US 7,039,999 B2
(45) Date of Patent: May 9, 2006

(54) METHOD FOR INSTALLATION OF SEMICONDUCTOR FABRICATION TOOLS

(76) Inventors: Adam L. Tarr, 223 Avenue D., Suite 10, Williston, VT (US) 05495; Gerald A. Chabot, 223 Avenue D., Suite 10, Williston, VT (US) 05495

( * ) Notice: Subject to any disclaimer, the term of this patent is extended or adjusted under 35 U.S.C. 154(b) by 383 days.

(21) Appl. No.: 10/423,282

(22) Filed: Apr. 25, 2003

(65) Prior Publication Data

US 2003/0200638 A1 Oct. 30, 2003

Related U.S. Application Data

(60) Provisional application No. 60/375,506, filed on Apr. 25, 2002.

(51) Int. Cl.
*B23P 21/00* (2006.01)
(52) U.S. Cl. ........................................................ 29/469
(58) Field of Classification Search ................ 29/25.01, 29/469, 722; 137/884
See application file for complete search history.

(56) References Cited

U.S. PATENT DOCUMENTS

| | | | | |
|---|---|---|---|---|
| 5,083,364 A | * | 1/1992 | Olbrich et al. ................. 29/564 |
| 5,441,076 A | * | 8/1995 | Moriya et al. ............... 137/486 |
| 5,662,143 A | * | 9/1997 | Caughran .................... 137/884 |
| 5,762,745 A | * | 6/1998 | Hirose ........................ 29/25.01 |
| 6,099,599 A | * | 8/2000 | Wu ............................. 29/25.01 |
| 6,312,525 B1 | * | 11/2001 | Bright et al. ................. 118/719 |
| 6,435,215 B1 | * | 8/2002 | Redemann et al. .......... 137/884 |
| 6,461,519 B1 | * | 10/2002 | Weltzer ....................... 29/25.01 |
| 6,502,054 B1 | * | 12/2002 | Mooring et al. ............. 702/150 |
| 6,598,279 B1 | * | 7/2003 | Morgan ....................... 29/25.01 |
| 6,827,788 B1 | * | 12/2004 | Takahashi .................... 118/719 |
| 6,853,872 B1 | * | 2/2005 | Nishihata et al. ........... 29/25.01 |
| 6,861,101 B1 | * | 3/2005 | Kowalsky et al. ........... 427/455 |
| 6,941,965 B1 | * | 9/2005 | Lull et al. ........................ 137/9 |
| 2002/0000029 A1 | * | 1/2002 | Emoto ......................... 29/25.01 |
| 2002/0033195 A1 | * | 3/2002 | Fujimoto et al. ............ 137/884 |
| 2004/0194268 A1 | * | 10/2004 | Halsey et al. ............... 29/25.01 |

* cited by examiner

*Primary Examiner*—David P. Bryant
(74) *Attorney, Agent, or Firm*—John W. O'Donnell, Esq.

(57) ABSTRACT

This process for the installation of semiconductor fabrication tools includes designing standard modules for connecting the sources of the process gases and liquids t so that, for each gas and liquid, the sources of each required gas and liquid only need to be connected to the standard module once instead of multiple connections to the fabrication tool and support equipment. The modules can be installed before the delivery of the tool so that connection to the site sources of gases and liquids can be accomplished with fewer connections and in much shorter time.

2 Claims, 2 Drawing Sheets

METHOD FOR INSTALLATION OF SEMICONDUCTOR FABRICATION TOOLS

This application claims priority from provisional application 60/375,506, filed Apr. 25, 2002, entitled Method for Installation of Semiconductor Fabrication Tools.

BACKGROUND

The installation of the semiconductor fabrication tools used in the semiconductor fabrication process involves connecting each tool and its support equipment to sources of process gases and liquids and support equipment at the tool site in the fabrication facility. Until now, the connection was usually done on site after the tool was delivered. The sources of the process gases and liquids were connected to the tools and support equipment in a series of individual connections and often involved a large number of connections and lengthy installation time.

DESCRIPTION OF THE INVENTION

This process for the installation of semiconductor fabrication tools includes designing standard modules for connecting the sources of the process gases and liquids and support equipment so that, for each gas and liquid, the sources of each required gas and liquid only need to be connected to the standard module once instead of multiple connections to the fabrication tool and support equipment. The modules can be installed before the delivery of the tool so that connection to the site sources of gases and liquids can be accomplished with fewer connections and in much shorter time.

The gases and liquids modules contain a plurality of manifolds that have a single inlet for the source of the process gas or liquid and plurality of outlets for connection to to the semiconductor fabrication tool, such plurality based on the process and design of the specific tool. Such standard gases and liquids modules can also facilitate the connection of the site source gases and liquids to the support equipment for the tools used in the semiconductor fabrication process.

In some cases, the connections from the site source of gases and liquids must meet certain clean room standards for the fabrication tool. The pre-assembly of the gasses and liquids modules can be done in a clean room facility so the connection at the site is further expedited.

This description of the invention is its preferred embodiment, but the disclosure is not intended to be limiting. Various alterations and modifications will be apparent to those skilled in the art and will be based on the requirement of the semiconductor fabrication tools themselves.

DETAILED DESCRIPTION OF DRAWINGS

Figure 1:
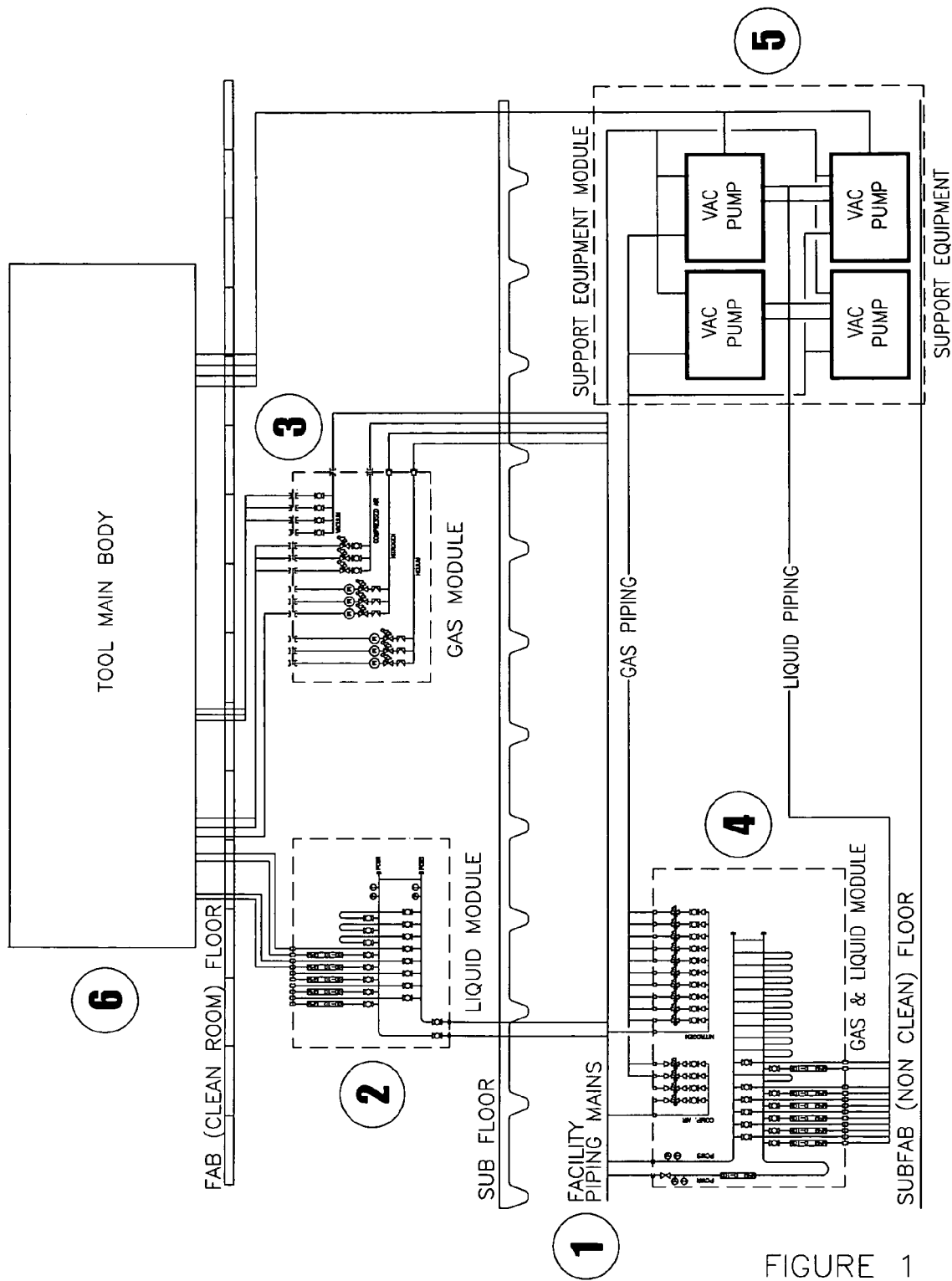
FIG. 1 shows a schematic view of the gas and liquid modules and their interconnection with the support equipment and semiconductor tool.

In FIG. 1, source gases and liquids (1) are supplied by the facility. The source liquid is connected to a single inlet in the liquid module (2) and the source gas is connected to a single inlet in the gas module (3). The gas and liquid modules are then connected to the semiconductor fabrication tool's support equipment (5) and then to the tool (6). In some cases, gases and liquids modules are pre-assembled into one unit (4) and connected in the same way.

Figure 2:
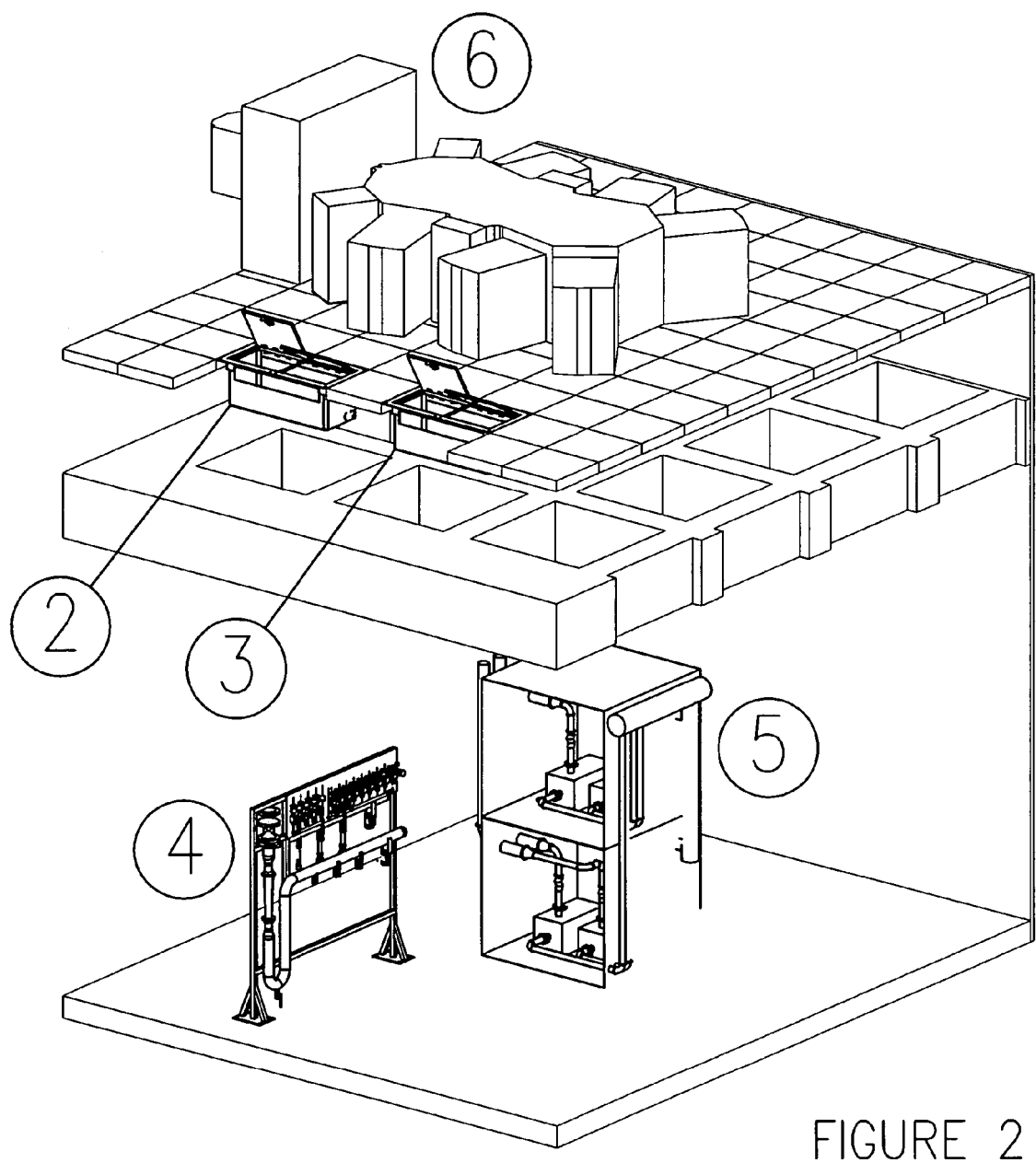
FIG. 2 shows a perspective view of the semiconductor fabrication facility incorporating the modules of the present invention.

FIG. 2 depicts the separate liquid module (2) and gas module (3), as well as a combined liquid/gas module (4), in relation to the semiconductor fabrication tool's support equipment (5) and the semiconductor fabrication tool (6).

We claim:

1. A method for the installation of semiconductor fabrication tools, comprising designing and assembling standard modules based on the semiconductor fabrication process requirements and the dimensions and configuration of the site where the semiconductor fabrication tool is to be installed;

pre-assembling one or more such standard modules for the delivery of a plurality of gases from the installation site source of such gases to the semiconductor fabrication tool and support equipment, each such gases module comprising one or more manifolds, each manifold with a single inlet and a plurality of outlets and means for controlling and monitoring flow and pressure of a gas;

pre-assembling one or more such standard modules for the delivery of a plurality of liquids from the installation site source of such liquids to the semiconductor fabrication tool and support equipment, each such liquids module comprising one or more manifolds, each manifold with a single inlet and a plurality of outlets and means for controlling and monitoring flow and pressure of a liquid;

placing the standard modules in proximity to the semiconductor fabrication tool and support equipment;

connecting the respective inlets of the gases modules to the installation site respective sources of gases and connecting the outlets of the gases modules to the semiconductor fabrication tool and support equipment; and connecting the respective inlets of the liquids modules to the installation site respective sources of liquids and connecting the outlets of the liquids modules to the semiconductor fabrication tool and support equipment.

2. The method for the installation of semiconductor fabrication tools as described in claim 1, where the pre-assembling of one or more of the gases modules or one or more of the liquids modules is performed in a clean room with certification equal or higher to the clean room certification of the facility where the semiconductor fabrication tool and support equipment are to be installed.

* * * * *